United States Patent
Lee et al.

(10) Patent No.: US 7,498,900 B2
(45) Date of Patent: Mar. 3, 2009

(54) SYSTEM ON CHIP STRUCTURE COMPRISING AIR CAVITY FOR ISOLATING ELEMENTS, DUPLEXER, AND DUPLEXER FABRICATION METHOD THEREOF

(75) Inventors: Joo-ho Lee, Seoul (KR); Hae-seok Park, Yongin-si (KR); In-sang Song, Seoul (KR); Byeoung-ju Ha, Seongnam-si (KR); Seog-woo Hong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 220 days.

(21) Appl. No.: 11/517,371

(22) Filed: Sep. 8, 2006

(65) Prior Publication Data

US 2007/0126527 A1 Jun. 7, 2007

(30) Foreign Application Priority Data

Dec. 7, 2005 (KR) .................... 10-2005-0119113

(51) Int. Cl.
*H03H 9/00* (2006.01)
(52) U.S. Cl. ...................... 333/133; 333/187
(58) Field of Classification Search ............. 333/133, 333/134, 187–189
See application file for complete search history.

(56) References Cited

U.S. PATENT DOCUMENTS

| 5,554,960 | A  | * | 9/1996 | Ohnuki et al. ............. 333/132 |
| 6,542,050 | B1 | * | 4/2003 | Arai et al. .................. 333/134 |
| 7,053,730 | B2 | * | 5/2006 | Park et al. .................. 333/133 |
| 7,253,703 | B2 | * | 8/2007 | Song et al. ................. 333/133 |
| 2007/0070608 | A1 | * | 3/2007 | Warren et al. .............. 361/735 |

FOREIGN PATENT DOCUMENTS

| CN | 1204148 A | 1/1999 |
| JP | 2000-244202 | 9/2000 |
| JP | 2005-094817 | 4/2005 |

* cited by examiner

*Primary Examiner*—Don P Le
(74) *Attorney, Agent, or Firm*—Sughrue Mion, PLLC

(57) ABSTRACT

A duplexer which prevents effects between transmitter and receiver filters. The duplexer include a substrate, a transmitter filter fabricated in a predetermined first area on a surface of the substrate, a receiver filter fabricated in a predetermined second area on the surface of the substrate and an air cavity fabricated in an area between the predetermined first and second areas by etching the substrate to isolate the transmitter and receiver filters from each other. The air cavity is fabricated in the substrate perpendicular to directions along which the transmitter and receiver filters are disposed. Accordingly, physical effects among elements can be effectively intercepted.

15 Claims, 6 Drawing Sheets

SYSTEM ON CHIP STRUCTURE COMPRISING AIR CAVITY FOR ISOLATING ELEMENTS, DUPLEXER, AND DUPLEXER FABRICATION METHOD THEREOF

CROSS-REFERENCE TO RELATED APPLICATIONS

This application claims the benefit under 35 U.S.C. § 119(a) of Korean Patent Application No. 10-2005-0119113, filed in the Korean Intellectual Property Office on Dec. 7, 2005, the entire disclosure of which is incorporated herein by reference.

BACKGROUND OF THE INVENTION

1. Field of the Invention

The present invention relates to a system on chip (SoC) structure, a duplexer, and a duplexer fabrication method thereof and, more particularly, to a SoC structure including an air cavity for isolating elements, a duplexer, and a duplexer fabrication method thereof.

2. Description of the Related Art

The demands for compact, multifunction electronic devices have been suddenly increased with the development of electronic technology. Thus, SoC technology has been introduced. SoC means technology for integrating a plurality of elements into one chip so as to realize one system. Chips fabricated using SoC technology are called SoC structures. In particular, efforts to fabricate various types of chips in the form of SoC have been made with the introduction of Micro-Electro-Mechanical Systems (MEMS) technology.

However, if a plurality of elements are integrated on one substrate, the possibility of interferences among the elements occurring is great. Also, if an element is driven, heat generated from the element may be transmitted through the substrate to another element so that the heat affects another element. Thus, SoC structures may malfunction during driving.

Various types of cellular phones, personal digital assistants (PDAs), note books, and the like have been developed and popularized with the development of radio communication technology. Such portable communication devices necessarily use duplexers. Such a duplexer as a kind of representative element complexly using a filter appropriately splits signals transmitted and received through an antenna in a communication system realized using a frequency division duplex (FDD) method so as to efficiently share the antenna. The duplexer basically includes a transmitter filter and a receiver filter. The transmitter filter is a band pass filter (BPF) passing only a frequency to be transmitted, and the receiver filter is a BPF passing only a frequency to be received. The transmitter and receiver filters pass only predetermined frequency band signals so as to efficiently share one antenna.

Efforts to fabricate such a duplexer in the form of a SoC structure have been made. As general technology for fabricating the duplexer in the form of SoC structure, a transmitter filter, a receiver filter, and a phase shifter are fabricated on a single substrate. The phase shifter generally includes a capacitor and an inductor to allow a frequency phase difference between the transmitted and received signals to be 90° so as to prevent the transmitted and received signals from being affected by each other.

However, the phase shifter isolates phases of the transmitted and received signals from each other but does not effectively intercept a physical effect such as heat or noise transmitted through a substrate. In particular, the substrate must have a very small area to fabricate the duplexer in the form of an SoC structure, and thus heat or noise is easily transmitted to another element. As a result, the whole system may make an error.

SUMMARY OF THE INVENTION

Accordingly, the present general inventive concept has been made to solve the above-mentioned and/or problems, and an aspect of the present general inventive concept is to provide a SoC structure including an air cavity for isolating a plurality of elements from one another.

Another aspect of the present general inventive concept is to provide a duplexer isolating a transmitter filter and a receiver filter fabricated on a single substrate from each other using an air cavity and a method of fabricating the duplexer.

According to an aspect of the present invention, there is provided a duplexer including: a substrate; a transmitter filter fabricated in a predetermined first area on a surface of the substrate; a receiver filter fabricated in a predetermined second area on the surface of the substrate; and an air cavity fabricated in an area between the predetermined first and second areas by etching the substrate to isolate the transmitter and receiver filters from each other.

The air cavity may be fabricated in the substrate perpendicular to directions along which the transmitter and receiver filters are disposed.

The duplexer may further include: an upper packaging substrate bonded to a surface of the substrate to package the transmitter and receiver filters; and a lower packaging substrate bonded to an other surface of the substrate to package the transmitter and receiver filters.

The upper packaging substrate may include a surface bonded to the substrate, an area of the surface corresponding to the transmitter and receiver filters being etched.

Each of the transmitter and receiver filters may include at least one or more air gap type serial resonators and at least one or more air gap type parallel resonators.

According to another aspect of the present invention, there is provided a SoC (system on chip) structure include: a substrate; a first circuit element fabricated in a first area of the substrate; a second circuit element fabricated in a second area of the substrate; and an air cavity fabricated between the first and second areas by etching the substrate to isolate the first and second circuit elements from each other.

The first circuit element may be an air gap type FBAR (film bulk acoustic resonator), and the second circuit element may be an RFIC (radio frequency integrated circuit).

According to another aspect of the present invention, there is provided a method of fabricating a duplexer, including: stacking lower electrodes in predetermined first and second areas on a surface of a substrate, respectively; stacking piezoelectric layers on the lower electrodes; stacking upper electrodes on the piezoelectric layers stacked on the lower electrodes; and etching the first and second areas, a lower portion of the substrate in an area between the first and second areas to fabricate a transmitter filter in the first area, a receiver filter in a second area, and an air cavity for isolating the transmitter and receiver filters from each other in the area.

The air cavity may be fabricated perpendicular to directions along which the transmitter and receiver filters are disposed.

The method may further include: bonding an upper packaging substrate to a surface of the substrate to package an upper part of the substrate; and bonding a lower packaging substrate to another surface of the substrate to package a lower part of the substrate.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF ILLUSTRATIVE, NON-LIMITING, EMBODIMENTS OF THE INVENTION

Figure 1:
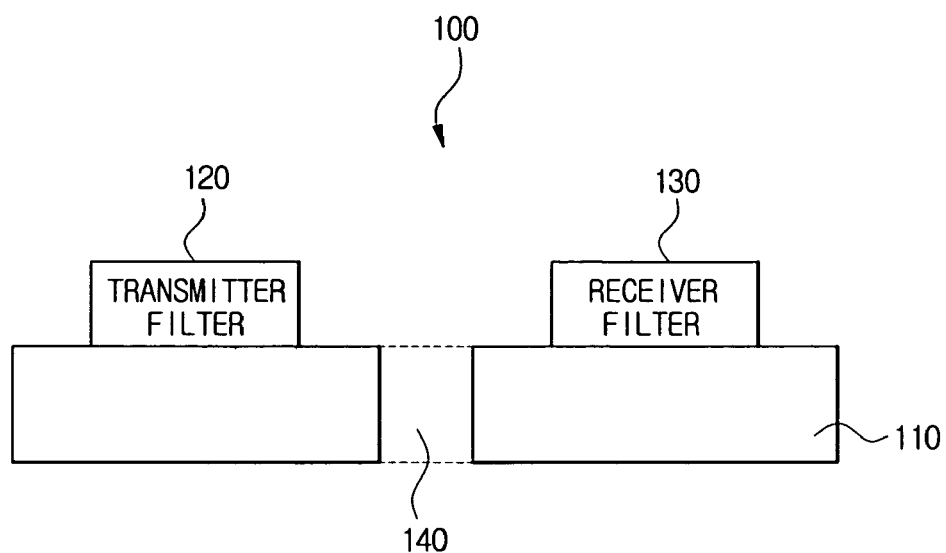
FIG. 1 is a schematic view illustrating a configuration of a duplexer according to an exemplary embodiment of the present invention.

Certain exemplary embodiments of the present invention will be described in greater detail with reference to the accompanying drawings.

In the following description, the same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

FIG. 1 is a schematic view illustrating a configuration of a duplexer according to an exemplary embodiment of the present invention. Referring to FIG. 1, a duplexer 100 includes a substrate 110, a transmitter filter 120, a receiver filter 130, and an air cavity 140.

The transmitter filter 120 passes a frequency band signal to be transmitted, and the receiver filter 130 passes a frequency band signal to be received. The transmitter filter 120 may be fabricated in a predetermined first area on a surface of the substrate 100, and the receiver filter 130 may be fabricated in a second area on the surface of the substrate 100.

In this case, the air cavity 140 is disposed in a space between the first and second areas. The air cavity 140 intercepts transmissions of heat, noise, and signals between the transmitter filter 120 and the receiver filter 130. In detail, the air cavity 140 is fabricated by etching a portion of the substrate 110 between the first and second areas so as to physically intercept a transmission of heat or noise.

Figure 2:
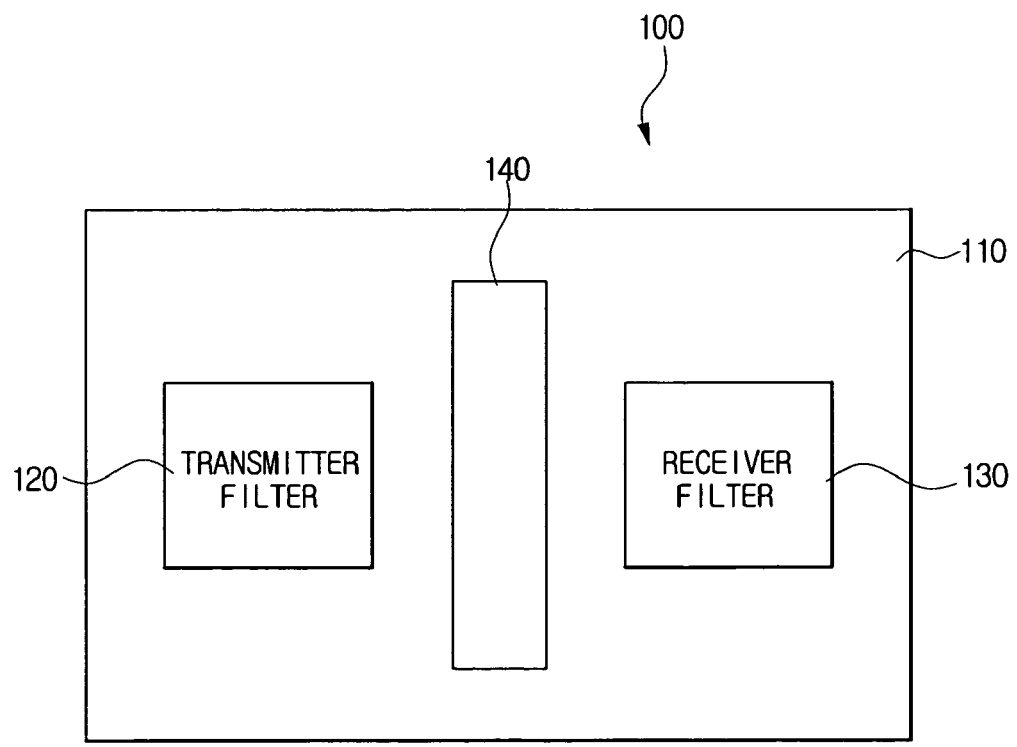
FIG. 2 is a plan view of the duplexer shown in FIG. 1.

FIG. 2 is a plan view of the duplexer shown in FIG. 1. Referring to FIG. 2, the air cavity 140 may be fabricated in the form of a long bar disposed perpendicular to directions along which the transmitter filter 120 and the receiver filter 130 are disposed. Alternatively, the air cavity 140 may be fabricated in the form of a dotted line having at least one or more both sides connected to each other. In this case, the air cavity 140 may be more solid than when being fabricated in the form of the long bar.

Figure 3:
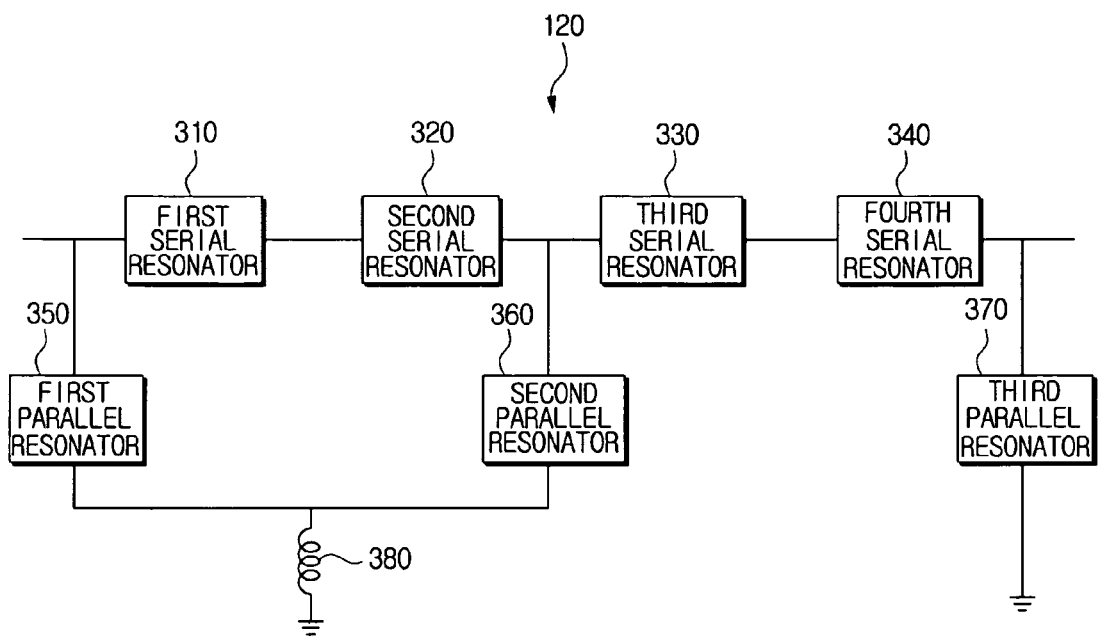
FIG. 3 is a schematic block diagram of a filter used in the duplexer shown in FIG. 1.

The transmitter filter 120 and the receiver filter 130 may each include a plurality of air gap type resonators. FIG. 3 is a schematic block diagram of the transmitter filter 120 of the transmitter and receiver filters 120 and 130. Other forms of acoustic resonators may also be used as filter elements. For example, the present invention could be fabricated with a solidly mounted resonator (SMR) or other acoustic resonator.

Referring to FIG. 3, the transmitter filter 120 includes a plurality of air gap type serial resonators 310, 320, 330 and 340, a plurality of air gap type parallel resonators 350, 360 and 370, and a trimming inductor 380. An operation of a filter including serial resonators (310, 320, 330 and 340) and parallel resonators (350, 360 and 370) as shown in FIG. 3 will be now described with a detailed example. In this case, anti-resonance frequencies and resonance frequencies of the serial resonators may be frequencies f1 and f2, respectively, and anti-resonance frequencies and resonance frequencies of the parallel resonators may be frequencies f3 and f4, respectively. If frequency characteristics of the serial or parallel resonators are adjusted so that the anti-resonance frequencies f3 of the parallel resonators coincide with the resonance frequencies f2 of the serial resonators, the filter may operate as a BPF passing only signals between frequency bands f1 through f4. In this case, a resonance frequency f2 of the BPF is equal to an anti-resonance frequency f3.

The trimming inductor 380 is added to improve an attenuation characteristic of the filter. In other words, the trimming inductor 380 attenuates a frequency in a band higher than a frequency band passed by the filter so as to reduce noise. A number of the trimming inductor 380 shown in FIG. 3 is one, but a plurality of trimming inductors may be fabricated to be respectively connected to the first and second parallel resonator 350 and 360. However, in this case, a size of an element is remarkably increased. Thus, the trimming inductor 380 may be commonly connected to the first and second parallel resonators 350 and 360 as shown in FIG. 3.

A capacitance value of the first parallel resonator 350 may be larger than a total capacitance value of the first and second serial resonators 310 and 320, and a capacitance value of the second parallel resonator 360 may be larger than a total capacitance value of the third and fourth serial resonators 330 and 340. Thus, an inductor having a relatively low inductance may be used as the trimming inductor 380. In detail, areas of the first and second parallel resonators 350 and 360 may be larger than areas of the first through fourth serial resonators 310 through 340 so that the first and second parallel resonators 350 and 360 have larger capacitance values.

The third parallel resonator 370 improves an attenuation characteristic in a band lower than a frequency pass band of the filter. An end of the third parallel resonator 370 is connected to a connection node between the fourth serial resonator 340 and an external port, and another end of the third parallel resonator 370 is connected to a ground node.

Figure 4:
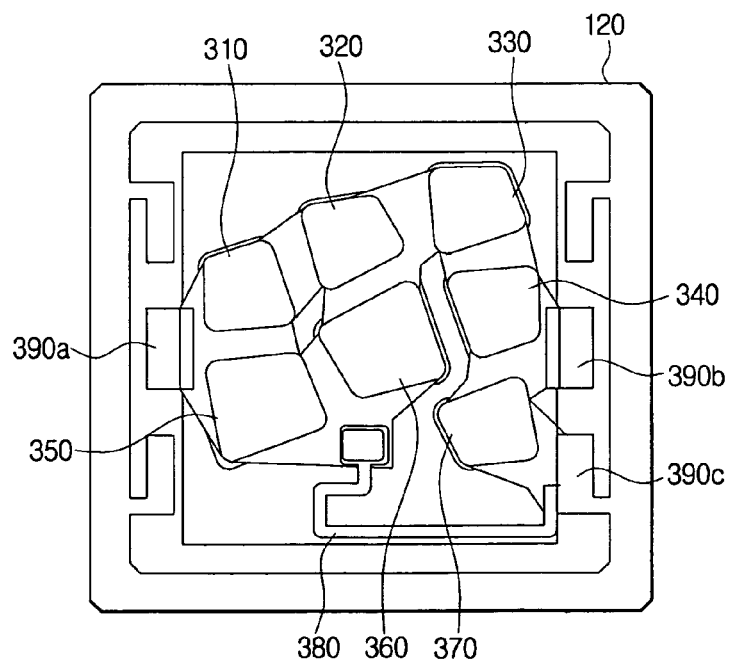
FIG. 4 is a plan view of the filter shown in FIG. 3.

FIG. 4 is a plan view of the transmitter filter 120 shown in FIG. 3. Referring to FIG. 4, the first through fourth serial resonators 310 through 340 are disposed in series to connect a transmitter port 390a to an antenna port 390b. An end of the trimming inductor 380 and an end of the third parallel resonator 370 are connected to a ground port 390c. The receiver filter 130 shown in FIG. 2 may be realized in a structure as shown in FIGS. 3 and 4.

Figure 5:
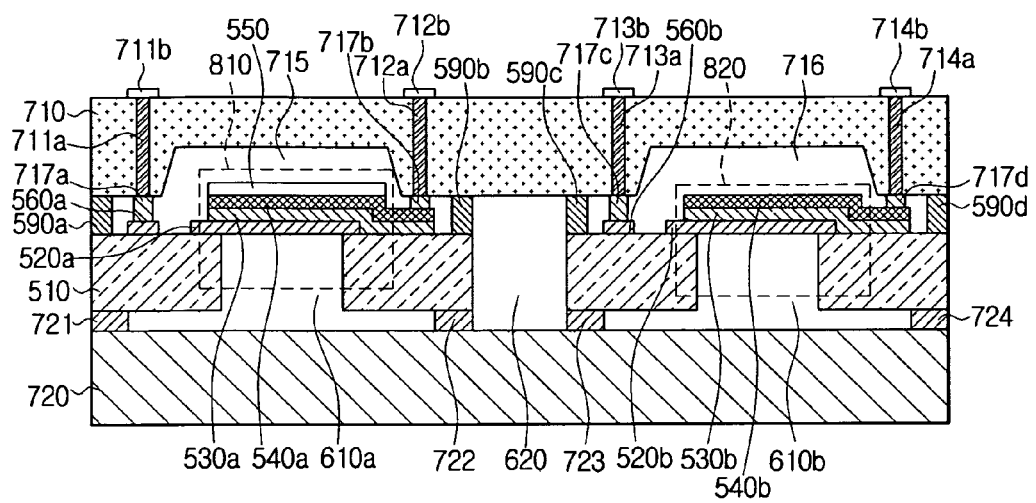
FIG. 5 is a vertical cross-sectional view of a duplexer according to another exemplary embodiment of the present invention.

FIG. 5 is a vertical cross-sectional view of a duplexer according to another exemplary embodiment of the present invention. Referring to FIG. 5, the duplexer includes a substrate 510, a transmitter filter 810, a receiver filter 820, an air cavity 620, an upper packaging substrate 710, and a lower packaging substrate 720.

The transmitter filter 810 is positioned in a first area of a surface of the substrate 510. The transmitter filter 810 includes an air gap 610a, a lower electrode 520a, a piezoelectric layer 530a, an upper electrode 540a, and a tuning layer 550. If a power is applied to the lower and upper electrodes 520a and 540a, the piezoelectric layer 530a produces a piezoelectric phenomenon by which electric energy is converted into mechanical energy of acoustic wave form, so as to induce a resonance. The lower electrode, 520a, the piezoelectric layer 530a, and the upper electrode 540a constitute a part inducing the resonance and thus referred to as a resonator part. The air gap 610a isolates the resonator part from the substrate 510 so that an acoustic wave is not affected by the substrate 510. The tuning layer 550 is stacked on the upper electrode 540a. A thickness of the resonator part of the transmitter filter 810 varies with a thickness of the tuning layer 550. Thus, the thickness of the tuning layer 550 may be adjusted to tune a resonance frequency band. In other words, a resonance frequency $f_0$ approximates to "$f_0=v/2d$ (wherein v is a speed of an acoustic wave of a piezoelectric layer, and d is a thickness of a resonator part)." Thus, the tuning layer 550 may be patterned to adjust the thickness d of the resonator part so as to tune the resonance frequency.

If a band lower than a received frequency band is used as a transmitted frequency band, the tuning layer 550 may be fabricated inside the transmitter filter 810. Referring to FIG. 5, the tuning layer 550 is additionally formed of a separate material from the upper electrode 540a to be stacked on the upper electrode 540a but may be formed of the same material as the upper electrode 540a. In other words, the upper electrode 540a may be fabricated thicker than the upper electrode 540b inside the receiver filter 820 to realize the tuning layer 550.

The receiver filter 820 is positioned in a second area of the surface of the substrate 510. The receiver filter 820 includes an air gap 610b, a lower electrode 520b, a piezoelectric layer 530b, and the upper electrode 540b. The receiver filter 820 has the same structure as the transmitter filter 810 except the tuning layer 550, and thus the detailed description of the receiver filter 820 will be omitted herein.

The air cavity 620 is fabricated in an area between the first and second areas. The air cavity 620 may be disposed perpendicular to directions along which the transmitter and receiver filters 810 and 820 are disposed and fabricated in the form of a long bar or a dotted line. The air cavity 620 may be fabricated by etching a rear surface of the substrate 510. In this case, air gaps 610a and 610b inside the transmitter and receiver filters 810 and 820 may be fabricated along with the air cavity 620.

The substrate 510 is bonded to the upper packaging substrate 710 through bonding materials 590a and 590b to package an upper part of the substrate 510. In this case, an area of a bonded surface of the upper packaging substrate 710 may be etched so that the transmitter and receiver filters 810 and 820 are positioned within the etched area, so as to reduce a whole height of an element and achieve solid bonding. FIG. 5 illustrates an etched area 715 corresponding to transmitter filter 810 and an etched area 716 corresponding to receiver filter 820.

The upper packaging substrate 710 may include a plurality of connection electrodes 711a, 712a, 713a and 714a, a plurality of upper pads 711b, 712b, 713b and 714b, and a plurality of lower pads 717a, 717b, 717c and 717d. The connection electrodes 711a through 714a may be connected to an external power supply through the upper pads 711b through 714b, respectively. The connection electrodes 711a through 714a may be connected to input and output nodes of the transmitter filter 810 and input and output nodes of the receiver filter 820 through the lower pads 717a through 717d, respectively. In detail, the first lower pad 717a is connected to a connection pad 560a of the transmitter filter 810. The connection pad 560a is electrically connected to a lower electrode 520a through the surface and an interior of the substrate 510. Also, the second lower pad 717b is connected to the upper electrode 540a of the transmitter filter 810. The third and fourth lower pads 717c and 717d are connected to a connection pad 560b and the upper electrode 540b of the receiver filter 820 in the same way. Thus, the transmitter and receiver filters 810 and 820 may be each conducted.

The substrate 510 is bonded to the lower packaging substrate 720 through bonding materials 721, 722, 723 and 724 to package a lower part of the substrate 510. Thus, foreign elements may be prevented from coming into the air gaps 610a and 610b and the air cavity 620.

Figure 6A:
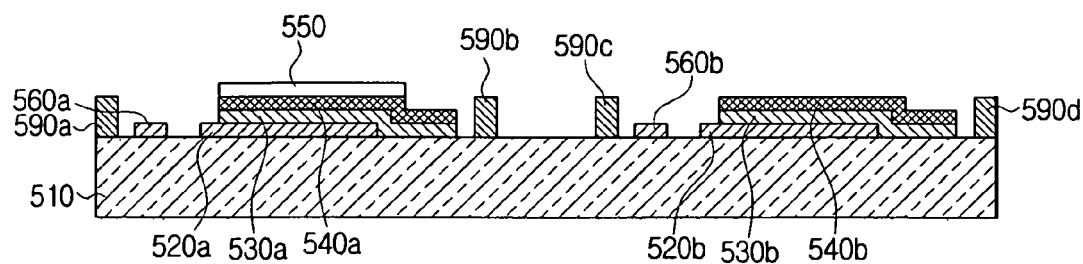
FIGS. 6A through 6C are vertical cross-sectional views illustrating a method of fabricating the duplexer shown in FIG. 5.
Figure 6B:
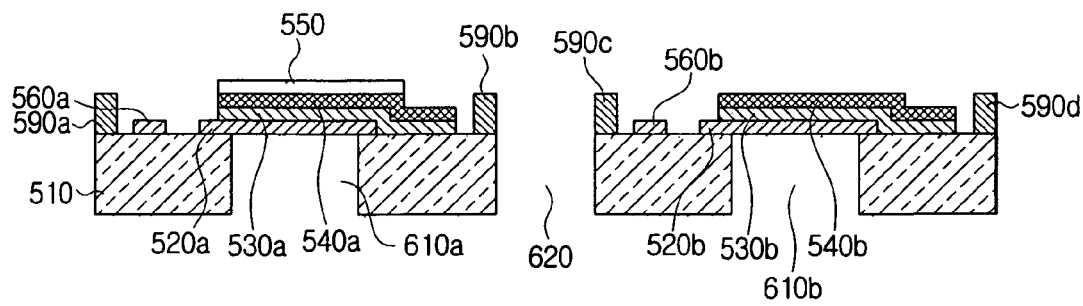
Figure 6C:
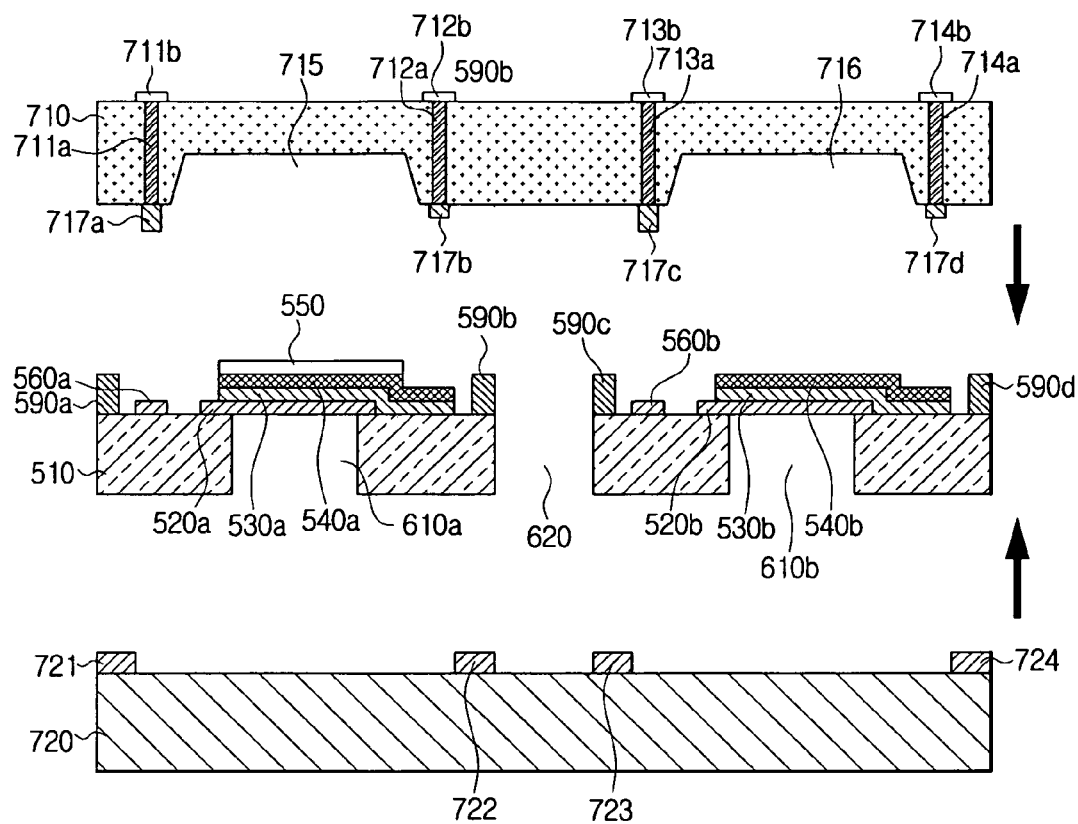

FIGS. 6A through 6C are vertical cross-sectional views illustrating a method of fabricating the duplexer shown in FIG. 5. As shown in FIG. 6A, the resonator part of the transmitter filter 810, a resonator part of the receiver filter 820, the connection pads 560a and 560b, and the bonding materials 590a, 590b, 590c and 590d are stacked.

In detail, a metal is stacked and patterned on an upper surface of the substrate 510 so that portions of the metal remains, so as to fabricate the lower electrodes 520a and 520b and the connection pads 560a and 560b. In detail, the metal may be aluminum (Al), tungsten (W), aurum (Au), platinum (Pt), nickel (Ni), titanium (Ti), chrome (Cr), palladium (Pd), molybdenum (Mo), or the like.

The piezoelectric layers 530a and 530b are stacked on areas of the lower electrodes 520a and 520b and areas of the substrate 510. The piezoelectric layers 530a and 530b may be fabricated through stacking and patterning processes like the lower electrodes 520a and 520b. The piezoelectric layers 530a and 530b may be fabricated using a general piezoelectric material such as aluminum nitride (AlN) or zinc oxide (ZnO). Thereafter, metals are stacked and patterned on the piezoelectric layers 530a and 530b to fabricate the upper electrodes 540a and 540b. Portions of the metal remains on the surface of the substrate 510 in the patterning process for fabricating the lower electrodes 520a and 520b or the upper electrodes 540a and 540b to provide the plurality of bonding materials 590a through 590d. Alternatively, the plurality of bonding materials 590a through 590d may be provided on the surface 510 through a separate process from the patterning process.

As shown in FIG. 6B, a lower surface of the substrate 510 is etched to form the air gaps 610a and 610b in the transmitter and receiver filters 810 and 820 along with the air cavity 620. Since the air cavity 620 is fabricated during the fabrication of the air gaps 610a and 610b, a whole process is simplified.

As shown in FIG. 6C, the upper packaging substrate 710 and the lower packaging substrate 720 are bonded to the upper and lower surfaces of the substrate 510, respectively, to package the upper and lower parts of the substrate 510. Here, the bonding method may be a method using an adhesive and a eutectic bonding method. A duplexer having a structure as shown in FIG. 5 may be fabricated using such a method.

Figure 7:
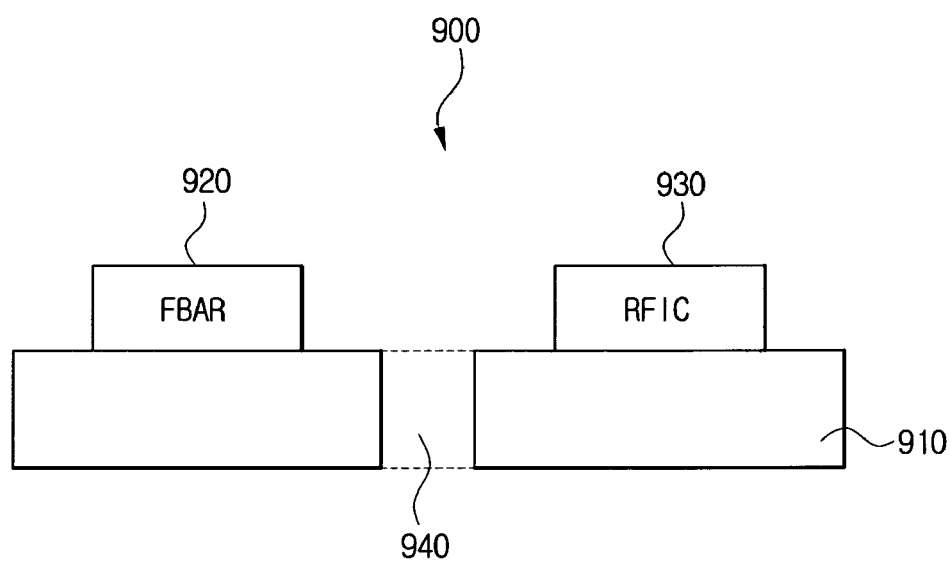
FIG. 7 is a schematic view illustrating a configuration of a SoC structure according to an exemplary embodiment of the present invention.

FIG. 7 is a schematic view illustrating a configuration of a SoC structure 900 according to another exemplary embodiment of the present invention. Referring to FIG. 7, the SoC structure 900 includes a substrate 910, a film bulk acoustic resonator (FBAR) 920, a radio frequency integrated circuit (RFIC) 930, and an air cavity 940. The FBAR 920 and the RFIC 930 are integrated on the substrate 910 as shown in FIG. 7, but various types of circuit elements may be integrated on the substrate 910. Here, the air cavity 940 may be disposed between the FBAR 920 and the RFIC 930 to intercept a transmission of heat or noise.

As described above, according to an aspect of the present invention, physical effects among elements integrated on a chip fabricated in the form of SoC can be effectively intercepted using an air cavity. Thus, heat or noise can be prevented from being transmitted to another element to prevent another element from malfunctioning. Also, when an element such as a FBAR requiring an air gap is fabricated, the air gap can be fabricated along with the air cavity so as to simplify a whole process. As a result, a structure of a SoC or a duplexer can be simplified.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A duplexer comprising:
    a substrate;
    a transmitter filter fabricated in a predetermined first area of the substrate;
    a receiver filter fabricated in a predetermined second area of the substrate; and
    an air cavity fabricated in an area between the predetermined first and second areas to isolate the transmitter and receiver filters from each other,
    wherein each of the transmitter and receiver filters comprises one or more air gap type serial resonators and one or more air gap type parallel resonators.

2. The duplexer of claim 1, wherein the air cavity is fabricated in the substrate perpendicular to directions along which the transmitter and receiver filters are disposed.

3. The duplexer of claim 1, further comprising:
    an upper packaging substrate bonded to a surface of the substrate to package the transmitter and receiver filters; and
    a lower packaging substrate bonded to an other surface of the substrate to package the transmitter and receiver filters.

4. The duplexer of claim 3, wherein the upper packaging substrate comprises a surface bonded to the substrate, and wherein areas of the surface of the upper packaging substrate corresponding to the transmitter and receiver filters are etched.

5. The duplexer of claim 2, further comprising:
    an upper packaging substrate bonded to a surface of the substrate to package the transmitter and receiver filters; and
    a lower packaging substrate bonded to an other surface of the substrate to package the transmitter and receiver filters.

6. The duplexer of claim 5, wherein the upper packaging substrate comprises a surface bonded to the substrate, and wherein areas of the surface of the upper packaging substrate corresponding to the transmitter and receiver filters are etched.

7. The duplexer of claim 1, wherein the air cavity is fabricated in the form of a dotted line.

8. The duplexer of claim 1, wherein the air cavity is fabricated in the form of a long bar.

9. The duplexer of claim 3, wherein the air cavity does not extend through the upper packaging substrate and the lower packaging substrate.

10. The duplexer of claim 6, wherein the air cavity does not extend through the upper packaging substrate and the lower packaging substrate.

11. A SoC (system on chip) structure comprising:
    a substrate;
    a first circuit element fabricated in a first area of the substrate;
    a second circuit element fabricated in a second area of the substrate; and
    an air cavity fabricated between the first and second areas by etching the substrate to isolate the first and second circuit elements from each other,
    wherein the first circuit element is an air gap type FBAR (film bulk acoustic resonator), and the second circuit element is an RFIC (radio frequency integrated circuit).

12. A method of fabricating a duplexer, comprising:
    stacking lower electrodes in predetermined first and second areas of a substrate, respectively;
    stacking piezoelectric layers on the lower electrodes;
    stacking upper electrodes on the piezoelectric layers stacked on the lower electrodes; and
    etching the first and second areas, a lower portion of the substrate in an area between the first and second areas to fabricate a transmitter filter in the first area, a receiver filter in a second area, and an air cavity for isolating the transmitter and receiver filters from each other in the area.

13. The method of claim 12, wherein the air cavity is fabricated perpendicular to directions along which the transmitter and receiver filters are disposed.

14. The method of claim 12, further comprising:
    bonding an upper packaging substrate to a surface of the substrate to package an upper part of the substrate; and
    bonding a lower packaging substrate to an other surface of the substrate to package a lower part of the substrate.

15. The method of claim 13, further comprising:
    bonding an upper packaging substrate to a surface of the substrate to package an upper part of the substrate; and
    bonding a lower packaging substrate to an other surface of the substrate to package a lower part of the substrate.

* * * * *